United States Patent
Löwenborg et al.

(10) Patent No.: US 6,476,754 B2
(45) Date of Patent: Nov. 5, 2002

(54) RECONSTRUCTION OF NONUNIFORMLY SAMPLED BANDLIMITED SIGNALS

(75) Inventors: Per Löwenborg; Håkan Johansson, both of Linköping (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 09/966,983

(22) Filed: Oct. 1, 2001

(65) Prior Publication Data
US 2002/0075177 A1 Jun. 20, 2002

(30) Foreign Application Priority Data
Oct. 2, 2000 (SE) .............................. 0003549

(51) Int. Cl.$^7$ .............................. H03M 1/12
(52) U.S. Cl. ........................................ 341/155
(58) Field of Search ................. 341/155, 156; 348/397.1

(56) References Cited

U.S. PATENT DOCUMENTS

| | | |
|---|---|---|
| 4,792,787 A | 12/1988 | Speiser et al. |
| 5,893,899 A | 4/1999 | Johnson et al. |
| 6,342,850 B1 * | 1/2002 | Borer et al. .............. 341/155 |

FOREIGN PATENT DOCUMENTS

EP  1006525A1 A  6/2000

* cited by examiner

Primary Examiner—Brian Young
(74) Attorney, Agent, or Firm—Burns, Doane, Swecker & Mathis, L.L.P.

(57) ABSTRACT

The present invention refers to a method and apparatus for reconstruction of a nonuniformly sampled bandlimited analog signal $x_a(t)$, said nonuniformly sampled signal comprising N subsequences $x_k(m)$, k=0, 1, ..., N-1, N≥2, obtained through sampling at a sampling rate of 1/(MT) according to $x_k(m)=x_a(nMT+t_k)$, where M is an integer, and $t_k=kMT/N+\Delta t_k$, $\Delta t_k$ being different from zero. The invention comprises forming a new sequence y(n) from said N subsequences $x_k(m)$ such that y(n) at least contains the same information as $x(n)=x_a(nT)$, i.e. $x_a(t)$ sampled with a sampling rate of 1/T, in a frequency region lower than $\omega_0$, $\omega_0$ being a predetermined limit frequency, by means of (i) upsampling each of said N subsequences $x_k(m)$, k=0, 1, ..., N-1, by a factor M, M being a positive integer; (ii) filtering each of said upsampled N subsequences $x_k(m)$, k=0, 1, ..., N-1, by a respective digital filter; and (iii) adding said N digitally filtered subsequences to form y(n). The respective digital filter is preferably a fractional delay filter and has preferably a frequency response $G_k=a_k e^{(-j\omega sT)}$, k=0, 1, ..., N-1, in the frequency band $|\omega T|\leq \omega_0 T$, $a_k$ being a constant and $s=d+t_k$, d being an integer.

28 Claims, 3 Drawing Sheets

RECONSTRUCTION OF NONUNIFORMLY SAMPLED BANDLIMITED SIGNALS

This application claims priority under 35 U.S.C. §§119 and/or 365 to 0003549-3 filed in Sweden on Oct. 2, 2000; the entire content of which is hereby incorporated by reference.

TECHNICAL FIELD OF THE INVENTION

The present invention generally relates to field of sampling, and more specifically, to methods and apparatus for reconstruction of nonuniformly sampled bandlimited signals, to methods and apparatus for compensation of time skew in time-interleaved analog-to-digital converters (ADCs), and to a computer program product for performing said methods of reconstruction.

DESCRIPTION OF RELATED ART AND BACKGROUND OF THE INVENTION

In uniform sampling, a sequence x(n) is obtained from an analog signal $x_a(t)$ by sampling the latter equidistantly at $t=nT$, $-\infty<n<\infty$, i.e., $x(n)=x_a(nT)$, T being the sampling period, as illustrated in FIG. 1a. In this case, the time between two consecutive sampling instances is always T. In nonuniform sampling, on the other hand, the time between two consecutive sample instances is dependent on the sampling instances. The present invention deals with the situation where the samples can be separated into N subsequences $x_k(m)$, $k=0, 1, \ldots, N-1$, where $x_k(m)$ is obtained by sampling $x_a(t)$ with the sampling rate $1/(MT)$ at $t=nMT+t_k$, i.e., $x_k(m)=x_a(nMT+t_k)$, M being a positive integer. This sampling scheme is illustrated in FIG. 1b for N=2 and M=2. Such nonuniformly sampled signals occur in, e.g., time-interleaved analog-to-digital converters (ADCs) due to time skew errors.

The question that arises is how to form a new sequence y(n) from $x_k(m)$ such that y(n) is either exactly or approximately (in some sense) equal to x(n). For conventional time-interleaved ADCs, N=M and, ideally, $t_k=kT$. In this case, y(n)=x(n) is obtained by simply interleaving $x_k(m)$. However, in practice, $t_k$ is not exactly equal to kT due to time skew errors which introduces aliasing components into $Y(e^{j\omega T})$, $Y(e^{j\omega T})$ being the Fourier transform of y(n). This means that y(n)≠x(n), and thus the information in y(n) is no longer the same as that in x(n).

It should be noted that it is well known that, if the $t_k$'s are distinct such that all samples are separated in time, then $x_a(t)$ is uniquely determined by the samples in the $x_k(m)$'s. It is also well known how to retain $x_a(t)$ from the $x_k(m)$'s using analog interpolation functions. However, these functions are not easily, if at all possible, achievable in practical implementations, which thus call for other solutions.

SUMMARY OF THE INVENTION

Accordingly, it is an object of the present invention to provide a method and an apparatus, respectively, for reconstruction of a nonuniformly sampled bandlimited analog signal $x_a(t)$, said nonuniformly sampled signal comprising N subsequences $x_k(m)$, $k=0, 1, \ldots, N-1$, $N\geq 2$, obtained through sampling at a sampling rate of $1/(MT)$ according to $x_k(m)=x_a(nMT+t_k)$, where M is a positive integer, and $t_k=kMT/N+\Delta t_k$, $\Delta t_k$ being different from zero, which are capable of forming a new sequence y(n) from said N subsequences $x_k(m)$ such that y(n) at least contains the same information as $x(n)=x_a(nT)$, i.e. $x_a(t)$ sampled with a sampling rate of 1/T, in a frequency region lower than $\omega_0$ (and possibly including $\omega_0$), $\omega_0$ being a predetermined limit frequency.

A further object of the present invention is to provide such method and apparatus, respectively, which are efficient, fast, simple, and of low cost.

Still a further object of the present invention is to provide such method and apparatus, respectively, which are capable of reducing noise such as e.g. quantization noise.

Those objects among others are attained by a method and an apparatus, respectively, which perform the steps of:

(i) upsampling each of the N subsequences $x_k(m)$, $k=0, 1, \ldots, N-1$, by the factor M;

(ii) filtering each of the upsampled N subsequences $x_k(m)$, $k=0, 1, \ldots, N-1$, by a respective digital filter; and (iii) adding the N digitally filtered subsequences to form y(n).

Preferably, the respective digital filter is a fractional delay filter and has a frequency response $G_k=a_k e^{(-j\omega sT)}$, $k=0, 1, \ldots, N-1$, in the frequency band $|\omega T|\leq \omega_0 T$, $a_k$ being a constant and s being different from an integer, and particularly s equals $d+t_k$, d being an integer.

If $\omega_0 T$ is a fixed value less than $\pi$, such that the original analog signal comprises frequency components of a higher frequency than $\omega_0$, regional perfect reconstruction is achieved, i.e. y(n) contains the same information as $x(n)=x_a(nT)$, i.e. $x_a(t)$ sampled with a sampling rate of 1/T, only in a frequency region $|\omega|\leq\omega_0$. Regionally perfect reconstruction is of particular interest in oversampled systems where the lower frequency components carry the essential information, whereas the higher frequency components contain undesired components (e.g., noise) to be removed by digital and/or analog filters.

Here, the fractional delay filters have a frequency response $G_k=a_k A_k(e^{j\omega T})$, $k=0, 1, \ldots, N-1$, in the frequency band $\omega_0 T<|\omega T|\leq\pi$, where $A_k(e^{j\omega T})$ is an arbitrary complex function.

If on the other hand $\omega_0$ does include all frequency components of the original analog signal (i.e. $\omega_0 T$ includes all frequencies up to $\pi$) perfect reconstruction is achieved, i.e. y(n) is identical with x(n).

In either case two different situations arise: (1) $2K_0+1=N$ and (2) $2K_0+1<N$, wherein $K_0$ is given by $$K_0 = \left\lceil \frac{M(\omega_0 T + \omega_1 T)}{2\pi} \right\rceil - 1$$

for regionally perfect reconstruction, wherein $\lceil x \rceil$ should be read as the smallest integer larger than or equal to x and $[-\omega_1, \omega_1]$ being the frequency band wherein said bandlimited analog signal $x_a(t)$ is found, respectively, and by $$K_0 = M-1$$

for perfect reconstruction.

In situation (1) the $a_k$'s are calculated as $$a = B^{-1} c,$$

a being the $a_k$'s in vector form given by $$a = [a_0 \ a_1 \ \ldots \ a_{N-1}]^T,$$

$B^{-1}$ being the inverse of $B$ as given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $$u_k = e^{-j\frac{2\pi}{MT}t_k},$$

and $c$ being $$c = [c_0 \; c_1 \; \ldots \; c_{2K_0}]^T,$$

wherein $$c_k = \begin{cases} M, & k = K_0 \\ 0, & k = 0, 1, \ldots, 2K_0, \; k \neq K_0 \end{cases}.$$

In situation (2) the $a_k$'s are calculated as $$a = \hat{B}^{-1}\hat{c},$$

$a$ being defined as $$a = [a_u \; a_{fix}]^T$$

wherein $a_u$ and $a_{fix}$ contain $(2K_0+1)$ unknown $a_k$'s and $L = N-2K_0-1$ fixed constant $a_k$'s, $\hat{B}^{-1}$ being the inverse of $\hat{B}$ as given by $$\hat{B} = \begin{bmatrix} B \\ S \end{bmatrix},$$

wherein $B$ is given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $$u_k = e^{-j\frac{2\pi}{MT}t_k},$$

$S$ is given by $$S = [S_z \; S_d],$$

wherein $$S_z = \begin{bmatrix} 0 & 0 & \cdots & 0 \\ 0 & 0 & \cdots & 0 \\ \vdots & \vdots & & \vdots \\ 0 & 0 & \cdots & 0 \end{bmatrix}$$

and $$S_d = \text{diag}[1 \; 1 \; \ldots \; 1],$$

and $\hat{c}$ being $$\hat{c} = [c \; a_{fix}]^T,$$

wherein $c$ is given by $$c = [c_0 \; c_1 \; \ldots \; c_{2k_0}]^T,$$

wherein $$c_k = \begin{cases} M, & k = K_0 \\ 0, & k = 0, 1, \ldots, 2K_0, \; k \neq K_0 \end{cases}.$$

Thus L $a_k$'s can be arbitrarily chosen. Preferably they are chosen to be zero in which case the corresponding channel is removed or to be M/N in which case any quantization noise can be minimized.

Further objects of the invention are to provide a method for compensation of time skew in a time-interleaved analog-to-digital converter (ADC) system comprising a plurality of analog-to-digital converters (ADCs), and to provide the ADC system itself.

Thus, such method and ADC system are provided comprising the respective method and apparatus as described above, wherein each of the N subsequences $x_k(m)$, k=0, 1, . . . , N–1, N≧2 is sampled by a respective one of the analog-to-digital converters.

Yet a further object of the present invention is to provide a computer program product for reconstruction of a nonuniformly sampled bandlimited analog signal.

Such object is attained by a computer program product loadable into the internal memory of a digital signal processing apparatus, comprising software code portions for performing any of the methods as depicted above when said product is run on said apparatus.

An advantage of the present invention is that a fully or partly reconstructed digital signal may be produced without the need of applying very complex and hardly implementable analog interpolation functions.

Further characteristics of the invention and advantages thereof will be evident from the following detailed description of embodiments of the invention.

BRIEF DESCRIPTION OF THE DRAWINGS

The present invention will become more fully understood from the detailed description of preferred embodiments of the present invention given hereinbelow and the accompanying FIGS. 1–6, which are given by way of illustration only, and thus are not limitative of the present invention.

DETAILED DESCRIPTION OF EMBODIMENTS

Figure 1:
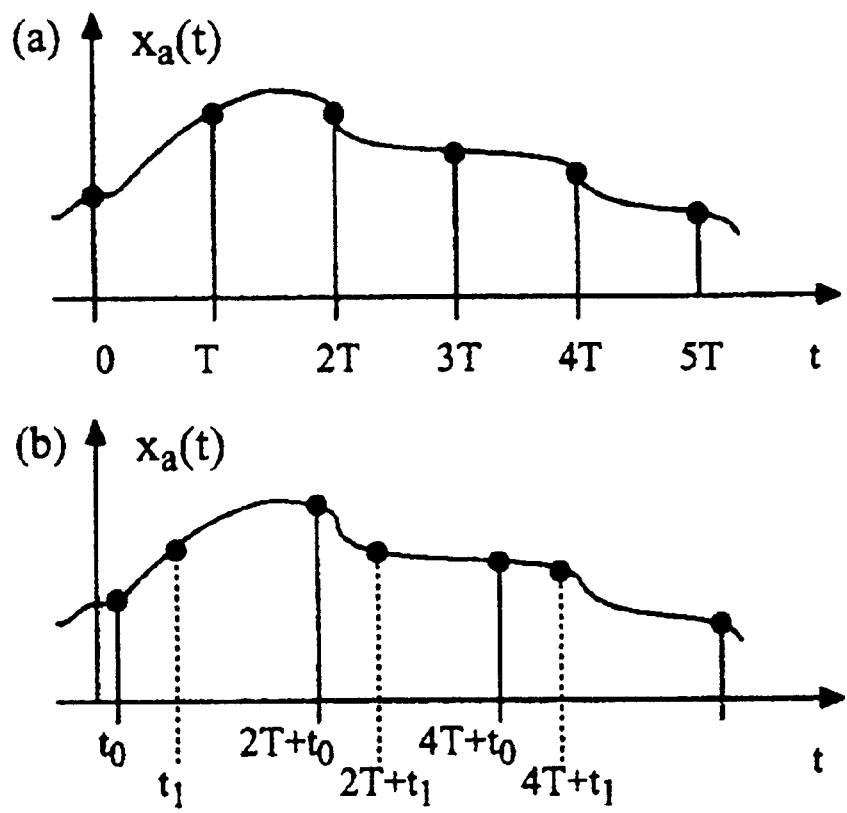
FIG. 1a illustrates schematically uniform sampling, wherein a sequence x(n) is obtained from an analog signal $x_a(t)$ by sampling the latter equidistantly at t=nT, –∞<n<∞, i.e., $x(n)=x_a(nT)$.
FIG. 1b illustrates schematically non-uniform sampling, wherein samples are separated into two subsequences $x_k(m)$, k=0, 1 where $x_k(m)$ is obtained by sampling $x_a(t)$ with the sampling rate 1/(2T) at $t=n2T+t_k$, i.e., $x_k(m)=x_a(n2T+t_k)$.

In the following description, for purposes of explanation and not limitation, specific details are set forth in order to provide a thorough understanding of the present invention. However, it will be apparent to one skilled in the art that the present invention may be practiced in other versions that depart from these specific details. In other instances, detailed descriptions of well-known methods and apparatuses are omitted so as not to obscure the description of the present invention with unnecessary details.

This invention considers the problem of reconstructing nonuniformly sampled bandlimited signals. Such problem arises in, e.g., time-interleaved analog-to-digital converters (ADCs) due to time skew errors. To be precise, we deal with the following situation. Given N subsequences $x_k(m)$, $k=0, 1, \ldots, N-1$, obtained through sampling of a bandlimited analog signal $x_a(t)$ with a sampling rate of $1/(MT)$ according to $x_k(m)=x_a(nMT+t_k)$. How to form a new sequence y(n) from $x_k(m)$ such that y(n) is either exactly or approximately (in some sense) equal to $x(n)=x_a(nT)$, i.e., $x_a(t)$ sampled with a sampling rate of $1/T$. To this end, we propose in this patent the use of an N-channel digital synthesis filter bank. The overall system can be viewed as a generalization of the conventional time-interleaved ADCs, to which the former reduces as a special case. We show that the proposed system, with proper ideal synthesis filters, can achieve y(n)=x(n). These synthesis filters are however not suitable to be approximated by practical digital filters. Therefore, we also consider the case in which y(n)≠x(n) but where y(n) and x(n) contain the same information in a lower frequency region. We show that the overall system can achieve $Y(e^{j\omega T})=X(e^{j\omega T})$ for $|\omega T|\leq\omega_0 T$, $Y(e^{j\omega T})$ and $X(e^{j\omega T})$ being the Fourier transforms of x(n) and y(n), respectively, and $\omega_0$ being a predetermined limit frequency, again with proper ideal synthesis filters, which in this case can be approximated by practical digital filters. This scheme is useful for (slightly) oversampled ADC systems where aliasing into the frequency band $\omega_0 T<|\omega T|\leq\pi$ can be tolerated. The ideal synthesis filters are allpass filters with, in general, different gain constants. We analyze the effects of using practical filters approximating the ideal ones.

The outline of the remaining parts of this description is as follows. Firstly, uniform sampling, upsampling, and hybrid analog/digital filter banks, the latter of which is convenient to use when analyzing nonuniformly sampled systems, are briefly recapitulated. The following section deals with nonuniform sampling and reconstruction. Thereafter, time-interleaved ADCs and their generalizations are considered. The subsequent section is concerned with error analysis and quantization noise, respectively. Finally, a list of equations (eqs.) is given, said equations being referred to in the above said sections.

Uniform Sampling, Upsampling, and Filter Banks

Figure 2:
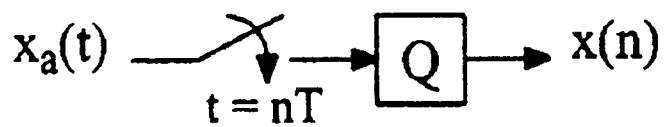
FIG. 2 illustrates schematically a uniform sampler and quantizer.

Uniform sampling and quantization are represented by the uniform sampler and quantizer in FIG. 2. Ignoring the quantization, the output sequence x(n) is obtained by sampling the analog input signal $x_a(t)$ uniformly at the time instances nT, for all n, see eq. (1) in the list of equations at the end of this description. Here, T is the sampling period and $f_{sample}=1/T$ is the sampling frequency. The Fourier transforms of x(n) and $x_a(t)$ are related according to Poisson's summation formula, see eq. (2).

Figure 3:
FIG. 3 illustrates schematically an upsampler.

The upsampler in FIG. 3 is used to increase the sampling frequency by a factor of M. The sampling period and sampling frequency associated with the lower rate, denoted here by $T_1$ and $f_{sample,1}$, respectively, are obviously related to T and $f_{sample}$ as in eq. (3). The output sequence y(n) is given by eq. (4) and the Fourier transforms of y(n) and x(m) are related to each other as in eq. (5).

Figure 4:
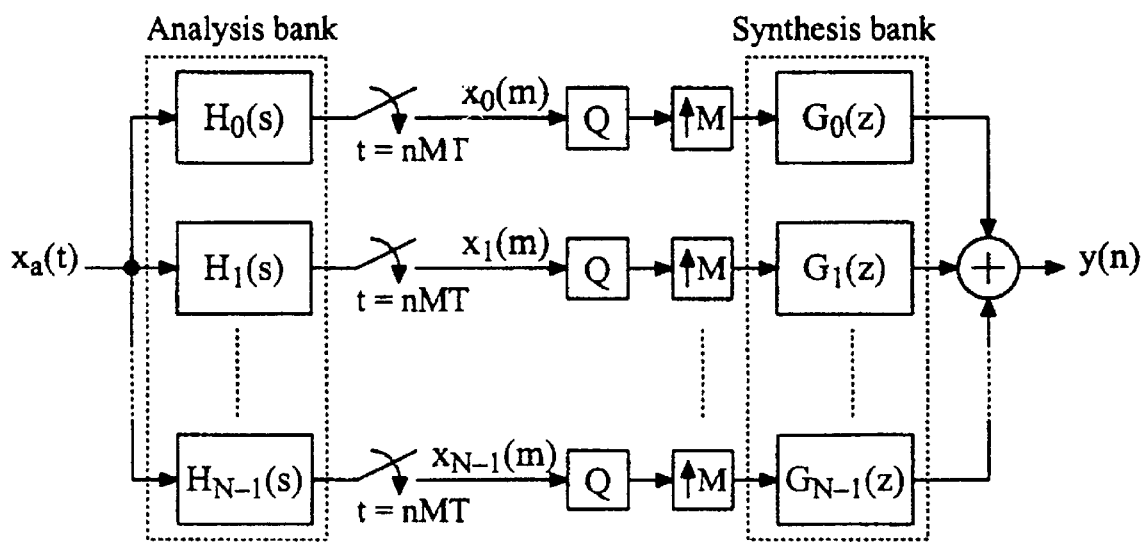
FIG. 4 illustrates schematically a hybrid analog/digital filter bank ADC system.

Consider the system in FIG. 4, which we refer to as a hybrid analog/digital filter bank or filter bank ADC. This system makes use of an analog analysis filter bank, uniform samplers and quantizers, and a digital synthesis filter bank. The sampling and quantization take place at the output of the analysis filters with a sampling frequency of $1/T=f_{sample}/M$, since $T_1=MT$. In the filter bank ADC, both the sampling and quantizations are thus performed at the low sampling rate $f_{sample}/M$.

Ignoring the quantizations in the system of FIG. 4, the Fourier transform of the output sequence y(n) is easily obtained with the aid of the above relations, see eq. (6) wherein $X_k(e^{jM\omega T})$ is given by eq. (7). Equation (6) can be rewritten as eq. (8) where $V_p(j\omega)$ is given by eq. (9).

Consider the systems in FIGS. 2 and 4 with $X(e^{j\omega T})$ and $Y(e^{j\omega T})$ as given by Eqs. (2) and (8), respectively. Recall that the spectrum of a sampled signal always is periodic with a period of $2\pi$ ($2\pi$-periodic). Thus, $X(e^{j\omega T})$ is apparently $2\pi$-periodic. This holds true also for $Y(e^{j\omega T})$ as long as all $G_k(e^{j\omega T})$ are $2\pi$-periodic. Thus, it suffices to consider $X(e^{j\omega T})$ and $Y(e^{j\omega T})$ in the interval $-\pi\leq\omega T\leq\pi$. We will now treat two different types of reconstruction.

Perfect reconstruction: The system in FIG. 4 has perfect reconstruction (PR) if Eq. (10) prevails for some non-zero constant c and integer constant d. In the time-domain we have in the PR case y(n)=cx(n−d). That is, with c=1, y(n) is simply a shifted version of x(n). From Eqs. (2), (8), and (10), we see that PR is obtained if Eq. (11) prevails for $-\infty\leq r\leq\infty$.

Regionally perfect reconstruction: Let x(n) and y(n) be separated as given by eq. (12) with corresponding Fourier transforms given by eqs. (13) and (14) where $\omega_0 T<\pi$. The system in FIG. 4 has regionally perfect reconstruction (RPR) if eq. (15) or, equivalently, eq. (16) prevails for some non-zero constant c and integer constant d. In the time-domain we have in the RPR case $y_{low}(n)=cx_{low}(n-d)$. That is, with c=1, $y_{low}(n)$ is simply a shifted version of $x_{low}(n)$. However, y(n) is not a shifted version of x(n), i.e., y(n)≠cx(n−d). From Eqs. (2), (8), and (16), we see that RPR is obtained if eq. (17) is fulfilled for $-\infty\leq r\leq\infty$. Regionally perfect reconstruction systems are of interest in oversampled systems where $x_{low}(n)$ carries the essential information, whereas $x_{high}(n)$ contains undesired components (e.g., noise) to be removed by digital and/or analog filters.

Bandlimited Cases: When $X_a(j\omega)$ is bandlimited, only a finite number of terms in the summations of eqs. (2) and (8) need to be handled in the interval $-\pi\leq\omega T\leq\pi$. We consider two different cases.

Case A (PR): Let $X_a(t)$ be bandlimited according to eq. (18). In this case, the Nyquist criterion for sampling with an effective sampling frequency of $1/T$ without aliasing is fulfilled. Thus, $x_a(t)$ can be retained if aliasing into the band $-\pi\leq\omega T\leq\pi$ is avoided.

Consider first x(n) in FIG. 2. From eq. (2), it is obvious that we have no aliasing in the region $-\pi\leq\omega T\leq\pi$ when $X_a(j\omega)$ is bandlimited according to eq. (18). Consider next y(n) in FIG. 4. In the region $-\pi\leq\omega T\leq\pi$, with $X_a(j\omega)$ being bandlimited according to eq. (18), it is easy to verify that we only need to consider $2K_0+1$ terms in eq. (8), for $p=-K_0, -(K_0-1), \ldots, K_0$, with $K_0$ given by eq. (19).

PR is now obtained if eq. (20) prevails, where $K_0$ is given by eq. (19). In this case, $x_a(t)$ can thus be retained from x(n) as well as y(n) provided that the system in FIG. 4 has PR.

Case B (RPR): Let $X_a(t)$ be bandlimited according to eq. (21) and separated according to eq. (22) with the corresponding Fourier transforms given by eqs. (23), (24), and (25).

In this case, $x_a(t)$ can not be retained but $x_{a,low}(t)$ can be retained as long as aliasing into the band $-\omega_0 T \leq \omega T \leq \omega_0 T$ is avoided.

Consider first x(n) in FIG. 2. In the region $-\pi \leq \omega T \leq \pi$, with $X_a(j\omega)$ being bandlimited according to Eqs. (21) and (25), it is obvious that we only need to consider 3 terms in eq. (2), for r=−1, 0, 1. Further, in the region $-\omega_0 T \leq \omega T \leq \omega_0 T$, with $\omega_0$ being given by eq. (25), it is easy to verify that we only need to consider one term, for r=0. That is, aliasing into this band is automatically avoided. Consider next y(n) in FIG. 4. In the region $-\pi \leq \omega T \leq \pi$, with $X_a(j\omega)$ being bandlimited according to Eqs. (21) and (25), it is easy to verify that we only need to consider $2K_0+1$ terms in eq. (8), for p=$-K_0$, $-(K_0-1)$, ..., $K_0$, with $K_0$ being given by eq. (26), where ⌈x⌉ stands for the smallest integer larger than or equal to x. Further, in the region $-\omega_0 T \leq \omega T \leq \omega_0 T$, with $\omega_0$ being given by eq. (25), it is readily verified that we only need to consider $2K_0+1$ terms in eq. (8), for p=$-K_0$, $-(K_0-1)$, ..., $K_0$, where $K_0$ is given by eq. (27).

RPR is now obtained if eq. (28) is fulfilled, wherein $K_0$ is given by eq. (27) and $A(j\omega)$ is some arbitrary function. In this case, $X_{a,low}(t)$ can thus be retained from x(n) as well as y(n) provided that the system in FIG. 4 has RPR.

Nonuniform Sampling and Reconstruction

Let $x_k(m)$, k=0, 1, ..., N−1, be N subsequences obtained through sampling of $x_a(t)$ at the time instances t=nMT+$t_k$, i.e. as given by eq. (29). For M=N=2, $x_a(t)$ is sampled according to FIG. 1b.

Figure 5:
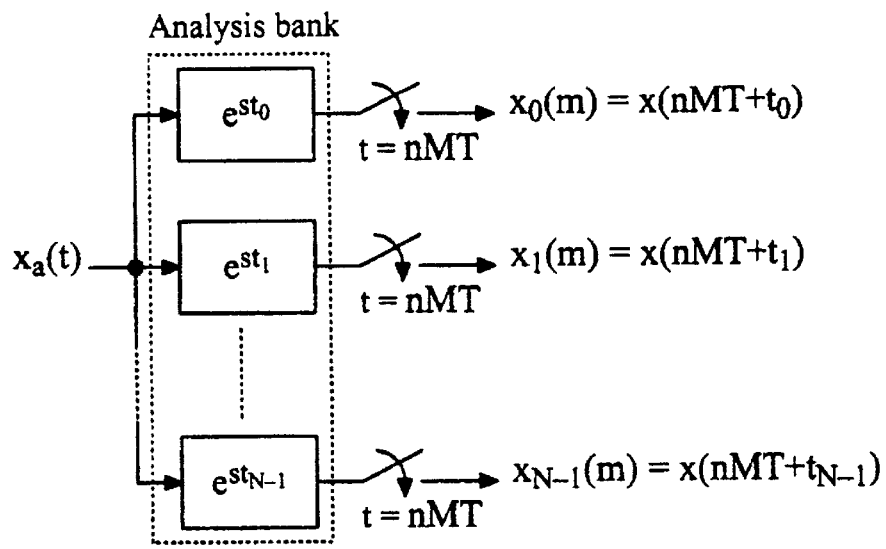
FIG. 5 illustrates schematically an analysis filter bank system for producing $x_k(m)$, k 0, 1, . . . , N–1, $x_k(m)$ being N subsequences obtained through sampling of $x_a(t)$ at the time instances $t=nMT+t_k$.

The subsequences $x_k(m)$ can be obtained by sampling the output signals from the analysis filters in FIG. 4 if these filters are selected according to eq. (30). The analysis filter bank is in this case as shown in FIG. 5.

Combining Eqs. (9) and (30) gives us eq. (31).

Next, it is shown how to choose the synthesis filters in the bandlimited cases A and B (see previous section) so that PR and RPR, respectively, are obtained.

Case A (PR case): In this case $X_a(t)$ is bandlimited according to eq. (18). Let $G_k(e^{j\omega T})$ be $2\pi$-periodic filters given by eq. (32). From eqs. (31) and (32), eq. (33) is obtained. For PR it is required that $V_p(j\omega)$ as given by eq. (33) fulfils eq. (20). That is, PR is obtained if eq. (34) is fulfilled.

Case B (RPR case): In this case $X_a(t)$ is bandlimited according to eq. (21). Let $G_k(e^{j\omega T})$ be $2\pi$-periodic filters given by eq. (35), where $A_k(e^{j\omega T})$ are some arbitrary complex functions. From eqs. (31) and (35) we obtain eq. (36), where $A(j\omega)$ is given by eq. (37).

For RPR it is required that $V_p(j\omega)$ as given by eq. (36) fulfils eq. (28). That is, RPR is obtained if, again eq. (34) is satisfied.

How to compute the $a_k$'s is next considered. For both PR and RPR (Cases A and B), eq. (34) must be fulfilled. This equation can be written in matrix form as eq. (38), where B is a $(2K_0+1)\times N$ matrix according to eq. (39), wherein the $u_k$'s are given by eq. (40). Further, a is a column vector with N elements and c is a column vector with $2K_0+1$ elements according to eqs. (41) and (42), respectively, where T stands for the transpose (without complex conjugate). The $a_k$'s are the unknowns whereas the $c_k$'s are given in accordance with eq. (43).

Eq. (38) is a linear system of $2K_0+1$ equations with N unknown parameters $a_k$. Hence, eq. (38) can be solved if $2K_0+1 \leq N$. We distinguish two different cases.

Case 1: $2K_0+1=N$. In this case, the number of unknowns equals the number of equations. The $a_k$'s can in this case be uniquely determined under the conditions stated by the following theorem.

Theorem 1: If B and c are as given by eqs. (39) and (42), respectively, $2K_0+1=N$, and $t_k \neq t_m+MTr$, k≠m, r∈Z, then there exists a unique a satisfying eq. (38), and thereby also unique $a_k$'s satisfying eq. (34). Further, all the $a_k$'s in a are real-valued constants.

Proof: We first prove that there exists a unique solution. Since $2K_0+1=N$, B is a square N×N matrix. If B is nonsingular, then a is uniquely determined by eq. (44), where $B^{-1}$ is the inverse of B. It thus suffices to show that B is nonsingular under the stated conditions. To this end, we first observe that B as given by eq. (39) can be written as in eq. (45), where A is given by eq. (46) and C is a diagonal matrix according to eq. (47).

The matrix A is a Vandermonde matrix. The necessary and sufficient condition for nonsingularity of A is therefore that the $u_k$'s are distinct, i.e., $U_k \neq u_m$, k≠m, which is the same condition as $t_k \neq t_m+MTr$, k≠m, r∈Z, due to eq. (40). Further, since the determinant of B is det B=det A det C, and |det C|=1, we obtain the relations as given in eq. (48). That is, B is nonsingular if and only if A is nonsingular. This proves that B is nonsingular and a unique solution a always exists under the stated conditions.

To prove that the $a_k$'s in a are real-valued constants we proceed as follows. Assume that we have the unique values $a_k$ that satisfy eq. (34). Using eq. (40), eq. (34) can equivalently be written as eq. (49), where x* stands for the complex conjugate of x. From eq. (49) we get eq. (50). This shows that the values $a_k^*$ satisfy eq. (34) as well. However, since $a_k$ are unique, it follows that they must be real-valued.

Case 2: $2K_0+1<N$. In this case, the number of unknowns exceeds the number of equations. We can therefore impose L=N−$2K_0$−1 additional linear constraints among the $a_k$'s and still satisfy eq. (34). Here, we restrict ourselves to the case in which the L $a_k$'s for k=N−L+1, N−L+2, ..., N, are fixed to some constants. This case covers the conventional time-interleaved ADCs with an even number of channels. Since L $a_k$'s are free we could of course set them to zero in the case of which the corresponding channels would be removed. In that sense, there is no need to consider the cases having an even number of channels. However, as we shall see below, it may be worth considering these cases in order to reduce the quantization noise at the output of the overall system.

The system of linear equations to be solved can here be written in matrix form as eq. (51) with B̂ being an N×N matrix, and a and ĉ being column vectors with N elements, according to eqs. (52), (53) and (54), respectively, where B is the $(2K_0+1)\times(2K_0+1)$ matrix as given by eq. (39), $a_u$ and $a_{fix}$ contain the $(2K_0+1)$ unknowns and L fixed constants of a, respectively, c is the column vector with $(2K_0+1)$ elements as given by eq. (43), S is an L×N matrix given by eq. (55), where $S_z$ is an L×$(2K_0+1)$ null matrix given by eq. (56), and $S_d$ is a L×L diagonal matrix where the diagonal elements are equal to one, see eq. (57).

As in Case 1, the $a_k$'s can in Case 2 be uniquely determined under the conditions stated by the following theorem.

Theorem 2: If B̂ and ĉ are as given by eqs. (52) and (54), respectively, $a_{fix}$ in eq. (53) contains L real fixed constants, $2K_0+1<N$, and $t_k \neq t_m+MTr$, k≠m, r∈Z, then there exists a unique a satisfying eq. (51), and thereby also unique $a_k$'s satisfying eq. (34). Further, all the $a_k$'s in a are real-valued constants.

Proof: The proof follows that of Theorem 1. To prove the existence and uniqueness, it thus suffices to show that B̂ is nonsingular under the stated conditions since a then is uniquely determined by eq. (58).

To prove nonsingularity of $\hat{B}$, we observe that its determinant is given by eq. (59), where $\tilde{B}$ is a $(2K_0+1)\times(2K_0+1)$ submatrix obtained from B by deleting L columns for $k=N-L+1, N-L+2, \ldots, N$, i.e. as given in eq. (60). We know from the proof of Theorem 1 that det $\tilde{B}\neq 0$ and thus det $\hat{B}\neq 0$ under the stated conditions. This proves that $\hat{B}$ is nonsingular and a unique solution always exists. The proof that the $a_k$'s in a are real-valued is done in the same manner as that of Theorem 1.

Time-interleaved ADCs and Their Generalizations

This section considers conventional time-interleaved ADCs and their generalizations. Consider first the case where N=M with $t_k$ being given by eqs. (61) and (62).

Further, let the synthesis filters $G_k(e^{j\omega T})$ be given by eq. (32) with $a_k=1$, $k=0, 1, \ldots, M-1$, $c=1$, and $d=0$, i.e., as in eq. (63). From eqs. (31) and (63) we obtain eq. (64).

Thus, PR is obtained. In this case we have a conventional time-interleaved ADC. The output sequence y(n) is here obtained by interleaving the $x_k(m)$'s.

In practice, $\Delta t_k$ will however no longer be exactly zero. If $\Delta t_k$ are known, the $a_k$'s can be computed according to eq. (44) if N is odd and $2K_0+1=N$, or according to eq. (58) if $2K_0+1<N$. In this case, PR can not be achieved since N=M and PR requires that $K_0=M-1$. Thus, neither $2K_0+1=N$ nor $2K_0+1<N$ can be fulfilled. RPR can, on the other hand, be obtained. For this case, the following question arises: given N=M and $K_0$, what is the maximum value of $\omega_0 T$ we can allow and still obtain RPR? It is readily established that to achieve RPR we must fulfill eq. (65). If $2K_0+1=N$ we get eq. (66).

Consider next the case where $N\neq M$ with $t_k$ being given by eqs. (67) and (68). Further, let the synthesis filters $G_k(e^{j\omega T})$ be given by eq. (32) with $a_k=M/N$, $k=0, 1, \ldots, N-1$, $c=1$, and $d=0$, i.e., as in eq. (69). From eqs. (31) and (69) we obtain eq. (70).

Thus, PR is obtained. In this case we have a system that can be viewed as a generalization of the time-interleaved ADCs. However, in this case we can no longer obtain the output sequence by interleaving the $x_k(m)$'s.

Again, $\Delta t_k$ will in practice no longer be exactly zero. If $\Delta t_k$ are known, the $a_k$'s can be computed according to eq. (44) if N is odd and $2K_0+1=N$, or according to eq. (58) if $2K_0+1<N$. As opposed to the M-channel case, we can here in the N-channel case achieve both PR and RPR by selecting $K_0$ according to eqs. (19) and (27), respectively, and of course choosing N so that $2K_0+1<N$. To achieve RPR, for given M and $K_0$, $\omega_0 T$ must again satisfy eq. (65). If $2K_0+1=N$ we get eq. (71). Hence, by increasing the number of channels we obtain RPR over a wider frequency region.

Error and Noise Analysis

Next an error analysis is provided. More precisely, we derive bounds on the errors in a and c, when B and a are replaced with $B+\Delta B$ and $a+\Delta a$, respectively. The errors in a are of interest as far as the quantization noise is concerned, as will become clear in the next section. The errors in c tell us how close to the ideal synthesis filters any practical filters must be in order to meet some prescribed allowable errors in c.

We will make use of the $L_\infty$-norms as defined by eq. (72) for an N×1 (1×N) vector x with elements $x_i$, and as defined by eq. (73) for an N×N matrix X with elements $x_{ik}$.

Errors in a: Consider first Case 1 with $2K_0+1=N$. Assume first that we have Ba=c for $t_k=d_k T$ and $a_k$. Assume next that $t_k=d_k T$ and $a_k$ are replaced with $t_k=d_k T+\Delta t_k$ and $a_k+\Delta a_k$, respectively, whereas c is kept fixed. This amounts to eq. (74). The matrix $\Delta B$ is an N×N matrix according to eq. (75), where $\Delta b_{pk}$ and $\Delta t_{pk}$ are given by eqs. (76) and (77), respectively.

Now, if eq. (78) is satisfied then it can be shown that eq. (79) holds. From eqs. (75)–(77) we get eq. (80).

We have B=AC and consequently $B^{-1}=C^{-1}A^{-1}$. Further, since A is here a DFT matrix, its inverse $A^{-1}$ is an IDFT matrix; hence $\|A^{-1}\|_\infty=1$. We also have $\|C^{-1}\|_\infty=1$ because $C^{-1}$ apparently is a diagonal matrix with diagonal elements $u_k^{K_0}$ where $u_k$ are given by eq. (40). We thus have eq. (81), which, together with eq. (80), results in eq. (82). By using eqs. (79)–(82), and assuming $\|\Delta B\|_\infty \|B^{-1}\|_\infty <<1$, we finally obtain eq. (83).

Consider next Case 2 with $2K_0+1<N$. This case is somewhat more difficult than Case 1 since we generally can not express $\hat{B}$ as a product between a DFT matrix and a diagonal matrix. However, if we restrict ourselves to the time-interleaved ADCs and their generalizations, it is readily shown that we can rewrite eq. (51) as eq. (84), where B' is an N×N matrix according to eq. (85) with $u_k$ being given by eq. (40), and c' is a column vector with N elements $c_k$ according to eq. (86)

Clearly, we can express B' as a product between a DFT matrix and a diagonal matrix. We will therefore end up with the same result as in Case 1, i.e., the bound in eq. (83).

Errors in c: Assume that we have Ba=c for $t_k=d_k T$ and $a_k$. Assume now that $t_k=d_k T$ and $a_k$ are replaced with $t_k=d_k T+\Delta t_{pk}$ and $a_k+\Delta a_k$, respectively. This amounts to eq. (87) from which we get eq. (88). In turn, from eq. (88) we obtain eq. (89). Using eqs. (39) and (75)–(77) we finally get eq. (90), which is useful in the design of the synthesis filters $G_k(z)$ Recall from above that the ideal filters should have the frequency responses $a_k e^{-jwt_k}$ over the frequency range of interest [if c=1 and d=0 in eqs. (32) and (35)]. In practice, $G_k(z)$ can of course only approximate the ideal responses. We can express the frequency responses of $G_k(z)$ as eq. (91), where $\Delta a_k(\omega T)$ and $\Delta t_{pk}(\omega T)$ are the deviations from the ideal magnitude and phase responses, respectively. Given the allowable errors in c, and eqs. (90) and (91), it is thus easy to design $G_k(z)$ so that the requirements are satisfied.

Figure 6:
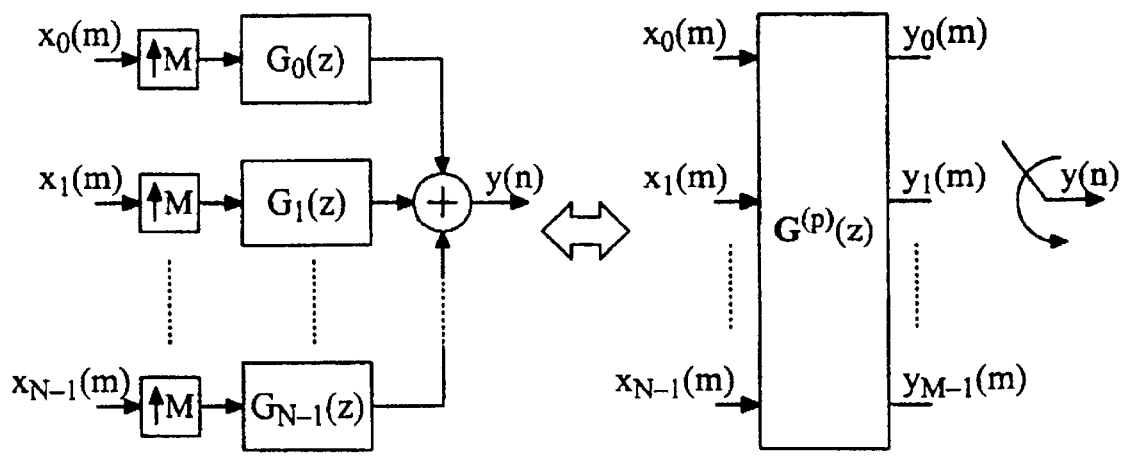
FIG. 6 illustrates schematically a polyphase representation of the upsampling and synthesis bank in the system of FIG. 4.

To analyze the noise variance at the output of the system in FIG. 4 it is convenient to represent the synthesis filter bank with its so called polyphase realization according to FIG. 6. The output sequence y(n) is obtained by interleaving the $y_i(m)$'s, $i=0, 1, \ldots, M-1$. The transfer function of the output y(n) is given by eq. (92), where Y(z) is given by eq. (93), X(z), Y(z), and $G^{(P)}(z)$ being defined in eqs. (94), (95), and (96), respectively. The $G_{ik}(z)$'s are the polyphase components of $G_k(z)$ according to eq. (97).

As usual in noise analysis, the quantization errors are modeled as stationary white noise. Let $x_k(m)$, $k=0, 1, \ldots, N-1$, be uncorrelated white noise sources having zero mean and variances $\sigma_{xk}^2$. Since $G^{(P)}(z)$ describes a linear and time-invariant system, the outputs $y_i(m)$, $i=0, 1, \ldots, M-1$, are also stationary white noise with zero mean. However, the variances of $y_i(m)$, denoted here by $\sigma_{yi}^2(n)$, are in general different, even when $\sigma_{xk}^2$ are equal. The outputs $y_i(m)$ may also be correlated. The output noise y(n) will therefore generally not be stationary. Its variance, denoted here by $\sigma_y^2(n)$, is thus time-variant. It is further periodic with period N since, obviously, eq. (98) holds.

We define the average quantization noise at the output in eq. (99). Given the synthesis filters $G_k(z)$ and its polyphase components $G_{ik}(z)$, $(\sigma_y^2)_{av}$ can be computed as in eq. (100).

Now, let the synthesis filters be given by eq. (101) and all input variances $\sigma_{xk}^2$ be equal according to eq. (102). Combining eqs. (100)–(102) gives us eq. (103).

A question that arises now is how to select the $a_k$'s so that $(\sigma_y^2)_{av}$ as given by (103) is minimized subject to the constraint that PR or RPR is simultaneously achieved. Let us consider the problem as defined by eq. (104). The constraint in eq. (104) is one of those that must be satisfied to obtain PR or RPR. Since the sum of the $a_k$'s is M, the objective function to be minimized in eq. (104) can be rewritten as eq. (105). Hence, the solution to eq. (104) is obtained for $a_k=M/N$, $k=0, 1, \ldots, N-1$, with the minimum value of $(\sigma_y^2)_{av}$ as in eq. (106).

This shows that the selection $a_k=M/N$, for the time-interleaved ADCs and their generalizations minimizes the average quantization noise at the output.

In practice $\Delta t_k$ will no longer be exactly zero which implies that $a_k$ are replaced with $a_k+\Delta a_k$. If $\Delta a_k$ are small (and $a_k>0$) the average quantization noise is in this case given by eq. (107). With $a_k=M/N$, we obtain eq. (108). The quantity is obtained from eq. (83).

The present invention has considered the problem of reconstructing nonuniformly sampled bandlimited signals using digital filter banks. The overall system can be viewed as a generalization of the conventional time-interleaved ADCs, to which the former reduces as a special case. By generalizing the time-interleaved ADCs, it is possible to eliminate the errors that are introduced in practice due to time skew errors. We consider both perfect reconstruction (PR) and regionally perfect reconstruction (RPR) systems and it is shown how to obtain such systems by selecting the (ideal) digital filters properly.

The method for reconstructing a nonuniformly sampled bandlimited signal may be implemented in any suitable digital signal processing apparatus such as e.g. dedicated hardware, or a computer. The method is in the latter case performed by means of a computer program product comprising software code portions loaded into the internal memory of a suitable apparatus.

It will be obvious that the invention may be varied in a plurality of ways. Such variations are not to be regarded as a departure from the scope of the invention. All such modifications as would be obvious to one skilled in the art are intended to be included within the scope of the appended claims.

The list of equations is presented at the following pages.

List of Equations $$x(n)=x_a(t)|_{t=nT}, -\infty \leq n \leq \infty \quad (1)$$

$$X(e^{j\omega T}) = \frac{1}{T}\sum_{r=-\infty}^{\infty} X_a\left(j\omega - j\frac{2\pi r}{T}\right) \quad (2)$$

$$T_1 = MT, \; f_{sample,1} = \frac{f_{sample}}{M} \quad (3)$$

$$y(n) = \begin{cases} x(n/M), & n=0, \pm M, \pm 2M, \ldots \\ 0, & \text{otherwise} \end{cases} \quad (4)$$

$$Y(e^{j\omega T})=X(e^{j\omega T_1})=X(e^{jM\omega T}) \quad (5)$$

$$Y(e^{j\omega T}) = \sum_{k=0}^{N-1} G_k(e^{j\omega T})X_k(e^{jM\omega T}) \quad (6)$$

-continued $$X_k(e^{jM\omega T}) = X_k(e^{j\omega T_1}) \quad (7)$$
$$= \frac{1}{T_1}\sum_{p=-\infty}^{\infty} H_k\left(j\omega - j\frac{2\pi p}{T_1}\right)X_a\left(j\omega - j\frac{2\pi p}{T_1}\right)$$
$$= \frac{1}{MT}\sum_{p=-\infty}^{\infty} H_k\left(j\omega - j\frac{2\pi p}{MT}\right)X_a\left(j\omega - j\frac{2\pi p}{MT}\right)$$

$$Y(e^{j\omega T}) = \frac{1}{T}\sum_{p=-\infty}^{\infty} V_p(j\omega)X_a\left(j\omega - j\frac{2\pi p}{MT}\right) \quad (8)$$

$$V_p(j\omega) = \frac{1}{M}\sum_{k=0}^{N-1} G_k(e^{j\omega T})H_k\left(j\omega - j\frac{2\pi p}{MT}\right) \quad (9)$$

$$Y(e^{j\omega T})=ce^{-jd\omega T}X(e^{j\omega T}), \; |\omega T| \leq \pi \quad (10)$$

$$V_p(j\omega) = \begin{cases} ce^{-jd\omega T}, & p=rM, \; |\omega| \leq \pi/T \\ 0, & p \neq rM, \; |\omega| \leq \pi/T \end{cases} \quad (11)$$

$$x(n)=x_{low}(n)+x_{high}(n)$$

$$y(n)=y_{low}(n)+y_{high}(n) \quad (12)$$

$$X(e^{j\omega T})=X_{low}(e^{j\omega T})+X_{high}(e^{j\omega T})$$

$$Y(e^{j\omega T})=Y_{low}(e^{j\omega T})+Y_{high}(e^{j\omega T}) \quad (13)$$

$$X_{low}(e^{j\omega T})=0, \; \omega_0 T \leq |\omega T| \leq \pi$$

$$X_{high}(e^{j\omega T})=0, \; |\omega T| \leq \omega_0 T$$

$$Y_{low}(e^{j\omega T})=0, \; \omega_0 T \leq |\omega T| \leq \pi$$

$$Y_{high}(e^{j\omega T})=0, \; |\omega T| \leq \omega_0 T \quad (14)$$

$$Y(e^{j\omega T})=ce^{-jd\omega T}X(e^{j\omega T}), \; |\omega T| \leq \omega_0 T \quad (15)$$

$$Y_{low}(e^{j\omega T})=ce^{-jd\omega T}X_{low}(e^{j\omega T}), \; |\omega T| \leq \pi \quad (16)$$

$$V_p(j\omega) = \begin{cases} ce^{-jd\omega T}, & p=rM, \; |\omega| \leq \omega_0 \\ 0, & p \neq rM, \; |\omega| \leq \omega_0 \end{cases} \quad (17)$$

$$X_a(j\omega)=0, \; |\omega| \geq \pi/T \quad (18)$$

$$K_0=M-1 \quad (19)$$

$$V_p(j\omega) = \begin{cases} ce^{-jd\omega T}, & p=0, \; |\omega|<\pi \\ 0, & |p|=1,2,\ldots,K_0, \; 0 \leq \omega \leq \pi \end{cases} \quad (20)$$

$$X_a(j\omega)=0, \; |\omega| \geq \omega_1 \quad (21)$$

$$x_a(t)=x_{a,low}(t)+x_{a,high}(t) \quad (22)$$

$$X_a(j\omega)=X_{a,low}(j\omega)+X_{a,high}(j\omega) \quad (23)$$

$$X_{low}(j\omega)=0, \; |\omega|>\omega_0$$

$$X_{high}(j\omega)=0, \; |\omega| \leq \omega_0, \; |\omega| \geq \omega_1 \quad (24)$$

$$0<\omega_0<\omega_1, \; \omega_0+\omega_1 \leq 2\pi/T \quad (25)$$

$$K_0 = \left\lceil \frac{M(\pi + \omega_1 T)}{2\pi} \right\rceil - 1 \tag{26}$$

$$K_0 = \left\lceil \frac{M(\omega_0 T + \omega_1 T)}{2\pi} \right\rceil - 1 \tag{27}$$

$$V_p(j\omega) = \begin{cases} ce^{-jd\omega T}, & p=0, |\omega| \leq \omega_0 \\ A(j\omega), & p=0, \omega_0 \leq |\omega| \leq \pi/T \\ 0, & |p|=1,2,\ldots,K_0, |\omega| \leq \omega_0 \end{cases} \tag{28}$$

$$x_k(m) = x(nMT + t_k), k=0, 1, \ldots, N-1 \tag{29}$$

$$H_k(s) = e^{st_k}, k=0, 1, \ldots, N-1 \tag{30}$$

$$V_p(j\omega) = \frac{1}{M}\sum_{k=0}^{N-1} G_k(e^{j\omega T})e^{j\left(\omega - \frac{2\pi p}{MT}\right)t_k} \tag{31}$$

$$G_k(e^{j\omega T}) = a_k c e^{-j\omega(t_k + dT)}, |\omega T| < \pi \tag{32}$$

$$V_p(j\omega) = \frac{1}{M} c e^{-jd\omega T} \sum_{k=0}^{N-1} a_k e^{-j\frac{2\pi p}{MT}t_k} \tag{33}$$

$$\sum_{k=0}^{N-1} a_k e^{-j\frac{2\pi p}{MT}t_k} = \begin{cases} M, & p=0 \\ 0, & |p|=1,2,\ldots,K_0 \end{cases} \tag{34}$$

$$G_k(e^{j\omega T}) = \begin{cases} a_k c e^{-j\omega(t_k + dT)}, & |\omega T| \leq \omega_0 T \\ a_k A_k(e^{j\omega T}), & \omega_0 T < |\omega T| \leq \pi \end{cases} \tag{35}$$

$$V_p(j\omega) = \begin{cases} \frac{1}{M} c e^{-jd\omega T}\sum_{k=0}^{N-1} a_k e^{-j\frac{2\pi p}{MT}t_k}, & |\omega T| \leq \omega_0 T \\ A(j\omega), & \omega_0 T < |\omega T| \leq \pi \end{cases} \tag{36}$$

$$A(j\omega) = \frac{1}{M}\sum_{k=0}^{N-1} a_k A_k(e^{j\omega T})e^{j\left(\omega - \frac{2\pi p}{MT}\right)t_k} \tag{37}$$

$$Ba = c \tag{38}$$

$$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix} \tag{39}$$

$$u_k = e^{-j\frac{2\pi}{MT}t_k} \tag{40}$$

$$a = [a_0\ a_1\ \ldots\ a_{N-1}]^T \tag{41}$$

$$c = [c_0\ c_1\ \ldots\ c_{2K_0}]^T \tag{42}$$

$$c_k = \begin{cases} M, & k=K_0 \\ 0, & k=0,1,\ldots,2K_0, k \neq K_0 \end{cases} \tag{43}$$

$$a = B^{-1}c \tag{44}$$

$$B = AC \tag{45}$$

$$A = \begin{bmatrix} 1 & 1 & \cdots & 1 \\ u_0 & u_1 & \cdots & u_{N-1} \\ \vdots & \vdots & & \vdots \\ u_0^{2K_0} & u_1^{2K_0} & \cdots & u_{N-1}^{2K_0} \end{bmatrix} \tag{46}$$

$$C = diag\begin{bmatrix} u_0^{-K_0} & u_1^{-K_0} & \cdots & u_{N-1}^{-K_0} \end{bmatrix} \tag{47}$$

$$\det A \neq 0 \Leftrightarrow \det B \neq 0$$
$$\det A = 0 \Leftrightarrow \det B = 0 \tag{48}$$

$$\sum_{k=0}^{N-1} a_k = M, \qquad p=0 \tag{49}$$

$$\sum_{k=0}^{N-1} a_k [u_k^p]^* = \sum_{k=0}^{N-1} a_k u_k^p = 0, \quad p=1,2,\ldots,K_0$$

$$\sum_{k=0}^{N-1} a_k^* = M, \qquad p=0 \tag{50}$$

$$\sum_{k=0}^{N-1} a_k^* u_k^p = \sum_{k=0}^{N-1} a_k^* [u_k^p]^* = 0, \quad p=1,2,\ldots,K_0$$

$$\hat{B}a = \hat{c} \tag{51}$$

$$\hat{B} = \begin{bmatrix} B \\ S \end{bmatrix} \tag{52}$$

$$a = [a_u\ a_{fix}]^T \tag{53}$$

$$\hat{c} = [c\ a_{fix}]^T \tag{54}$$

$$S = [S_z\ S_d] \tag{55}$$

$$S_z = \begin{bmatrix} 0 & 0 & \cdots & 0 \\ 0 & 0 & \cdots & 0 \\ \vdots & \vdots & & \vdots \\ 0 & 0 & \cdots & 0 \end{bmatrix}, \tag{56}$$

$$S_d = diag[1\ 1\ \ldots\ 1]. \tag{57}$$

$$a = \hat{B}^{-1}\hat{c} \tag{58}$$

$$det\hat{B} = det\tilde{B}\prod_{l=0}^{L-1} S_{d,ll} = det\tilde{B} \tag{59}$$

$$\tilde{B} = \begin{bmatrix} u_0^{-K_0} & u_1^{-K_0} & \cdots & u_{2K_0}^{-K_0} \\ u_0^{-(K_0-1)} & u_1^{-(K_0-1)} & \cdots & u_{2K_0}^{-(K_0-1)} \\ \vdots & \vdots & & \vdots \\ u_0^{K_0} & u_1^{K_0} & \cdots & u_{2K_0}^{K_0} \end{bmatrix} \tag{60}$$

$$t_k = d_k T + \Delta t_k, k=0, 1, \ldots, M-1 \tag{61}$$

$$d_k = k, k=0, 1, \ldots, M-1$$

$$\Delta t_k = 0, k=0, 1, \ldots, M-1 \tag{62}$$

$$G_k(e^{j\omega T}) = e^{-jk\omega T}, |\omega T| < \pi \tag{63}$$

$$V_p(j\omega) = \frac{1}{M}\sum_{k=0}^{M-1} e^{-j2\pi p \frac{k}{M}} = \begin{cases} 1, & p=0 \\ 0, & p \neq 0 \end{cases} \quad (64)$$

$$\omega_0 T \leq \frac{2\pi(K_0+1)}{M} - \omega_1 T \quad (65)$$

$$\omega_0 T \leq \frac{\pi(M+1)}{M} - \omega_1 T = \frac{\pi}{M} + \pi - \omega_1 T \quad (66)$$

$$t_k = d_k T + \Delta t_k, \, k=0, 1, \ldots, N=1 \quad (67)$$

$$d_k = \frac{kM}{N}, \quad k=0, 1, \ldots, N-1 \quad (68)$$

$$\Delta t_k = 0, \, k=0, 1, \ldots, N-1 \quad (68)$$

$$G_k(e^{j\omega T}) = \frac{M}{N} e^{\frac{-jMk\omega T}{N}}, \quad |\omega T| < \pi \quad (69)$$

$$V_p(j\omega) = \frac{1}{N}\sum_{k=0}^{N-1} e^{-j2\pi p \frac{k}{N}} = \begin{cases} 1, & p=0 \\ 0, & p \neq 0 \end{cases} \quad (70)$$

$$\omega_0 T \leq \frac{\pi(N+1)}{M} - \omega_1 T \quad (71)$$

$$\|x\|_\infty = \max|x_i|, \, 0 \leq i \leq N-1 \quad (72)$$

$$\|X\|_\infty = \max \sum_{k=0}^{N-1} |x_{ik}|, \quad 0 \leq i \leq N-1 \quad (73)$$

$$(B+\Delta B)(a+\Delta a) = c. \quad (74)$$

$$\Delta B = \begin{bmatrix} \Delta b_{-K_0,0} & \Delta b_{-K_0,1} & \cdots & \Delta b_{-K_0,N-1} \\ \Delta b_{-(K_0-1),0} & \Delta b_{-(K_0-1),1} & \cdots & \Delta b_{-(K_0-1),N-1} \\ \vdots & \vdots & & \vdots \\ \Delta b_{K_0,0} & \Delta b_{K_0,1} & \cdots & \Delta b_{K_0,N-1} \end{bmatrix} \quad (75)$$

$$\Delta b_{pk} = e^{j2\pi p \frac{k}{M}}\left(e^{j\Delta t_{pk}} - 1\right) \quad (76)$$

$$\Delta t_{pk} = \frac{2\pi p}{MT} \Delta t_k \quad (77)$$

$$\|\Delta B\|_\infty \cdot \|B^{-1}\|_\infty < 1 \quad (78)$$

$$\frac{\|\Delta a\|_\infty}{\|a\|_\infty} \leq \frac{\|\Delta B\|_\infty \cdot \|B^{-1}\|_\infty}{1 - \|\Delta B\|_\infty \cdot \|B^{-1}\|_\infty} \quad (79)$$

$$\|\Delta B\|_\infty = \max \sum_{k=0}^{N-1} |\Delta b_{pk}| \approx \max \sum_{k=0}^{N-1} |\Delta t_{pk}| \leq \frac{N(N-1)\pi}{M} \cdot \max\left\{\frac{|\Delta t_k|}{T}\right\}. \quad (80)$$

$$\|B^{-1}\|_\infty \leq \|C^{-1}\|_\infty \cdot \|A^{-1}\|_\infty = 1 \quad (81)$$

$$\|\Delta B\|_\infty \cdot \|B^{-1}\|_\infty \leq \frac{N(N-1)\pi}{M} \cdot \max\left\{\frac{|\Delta t_k|}{T}\right\}. \quad (82)$$

-continued $$\|\Delta a\|_\infty \leq \|a\|_\infty N(N-1)\frac{\pi}{M} \cdot \max\left\{\frac{|\Delta t_k|}{T}\right\}. \quad (83)$$

$$B'a = c' \quad (84)$$

$$B' = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{N-K_0-1} & u_1^{N-K_0-1} & \cdots & u_{N-1}^{N-K_0-1} \end{bmatrix} \quad (85)$$

$$c_k = \begin{cases} M, & k = K_0 \\ 0, & k=0, 1, \ldots, N-1, \, k \neq K_0 \end{cases} \quad (86)$$

$$(B+\Delta B)(a+\Delta a) = c + \Delta c \quad (87)$$

$$\Delta c = B\Delta a + \Delta B a + \Delta B \Delta a \quad (88)$$

$$\|\Delta c\|_\infty \|B\|_\infty \leq \|\Delta a\|_\infty + \|\Delta B\|_\infty \|a\|_\infty + \|\Delta B\|_\infty \|\Delta a\|_\infty \quad (89)$$

$$\|\Delta c\|_\infty < N\max\{|\Delta a_k|\} + N\max\{|\Delta t_{pk}|\}\max\{|a_k|\} + N\max\{|\Delta t_{pk}|\}\max\{|\Delta a_k|\} \approx N(\max\{|\Delta a_k|\} + \max\{|\Delta t_{pk}|\}\max\{|a_k|\}) \quad (90)$$

$$G_k(e^{j\omega T}) = [a_k + \Delta a_k(\omega T)]e^{-j[\omega t_k + \Delta t_{pk}(\omega T)]} \quad (91)$$

$$Y(z) = \sum_{i=0}^{M-1} z^{-i} Y_i(z^M) \quad (92)$$

$$Y(z) = G^{(p)}(z) X(z) \quad (93)$$

$$X(z) = [X_0(z) \, X_1(z) \ldots X_{N-1}(z)]^T \quad (94)$$

$$Y(z) = [Y_0(z) \, Y_1(z) \ldots Y_{N-1}(z)]^T \quad (95)$$

$$G^{(p)}(z) = \begin{bmatrix} G_{00}(z) & G_{01}(z) & \cdots & G_{0,N-1}(z) \\ G_{10}(z) & G_{11}(z) & \cdots & G_{1,N-1}(z) \\ \vdots & \vdots & & \vdots \\ G_{M-1,0}(z) & G_{M-1,1}(z) & \cdots & G_{M-1,N-1}(z) \end{bmatrix} \quad (96)$$

$$G_k(z) = \sum_{i=0}^{M-1} z^{-i} G_{ik}(z^M) \quad (97)$$

$$\sigma_y^2(nM+i) = \sigma_{y_i}^2 \quad (98)$$

$$(\sigma_y^2)_{av} = \frac{1}{M}\sum_{i=0}^{M-1} \sigma_{y_i}^2 \quad (99)$$

-continued $$(\sigma_y^2)_{av} = \frac{1}{M} \sum_{i=0}^{M-1} \sigma_{y_i}^2 \tag{100}$$

$$= \frac{1}{M} \sum_{i=0}^{M-1} \sum_{k=0}^{N-1} \sigma_{x_k}^2 \sum_{n=-\infty}^{\infty} |g_{ik}(n)|^2$$

$$= \frac{1}{M} \sum_{k=0}^{N-1} \sigma_{x_k}^2 \sum_{i=0}^{M-1} \sum_{n=-\infty}^{\infty} |g_{ik}(n)|^2$$

$$= \frac{1}{M} \sum_{k=0}^{N-1} \sigma_{x_k}^2 \sum_{n=-\infty}^{\infty} |g_k(n)|^2$$

$$= \frac{1}{M} \sum_{k=0}^{N-1} \sigma_{x_k}^2 \frac{1}{2\pi} \int_{-\pi}^{\pi} |G_k(e^{j\omega T})|^2 \, d\omega T$$

$$G_k(e^{j\omega T}) = \begin{cases} a_K e^{-jMk\omega T/N}, & |\omega T| < \omega_c T \\ 0, & \omega_c T \leq |\omega T| \leq \pi \end{cases} \tag{101}$$

$$\sigma_{x_k}^2 = \sigma_x^2. \tag{102}$$

$$(\sigma_y^2)_{av} = \frac{\omega_c T}{M\pi} \sigma_x^2 \sum_{k=0}^{N-1} a_k^2 \tag{103}$$

$$\text{minimize} \sum_{k=0}^{N-1} a_k^2 \text{ subject to } \sum_{k=0}^{N-1} a_k = M \tag{104}$$

$$\sum_{k=0}^{N-1} a_k^2 = \left(\sum_{k=0}^{N-1} a_k\right)^2 + \sum_{k=0}^{N-2} \sum_{q=k+1}^{N-1} (a_k - a_q)^2 \tag{105}$$

$$= M^2 + \sum_{k=0}^{N-2} \sum_{q=k+1}^{N-1} (a_k - a_q)^2$$

$$(\sigma_y^2)_{av,min} = \frac{M\omega_c T}{N\pi} \sigma_x^2 \tag{106}$$

$$(\sigma_y^2)_{av} = \frac{\omega_c T}{M\pi} \sigma_x^2 \sum_{k=0}^{N-1} (a_k + \Delta a_k)^2 \tag{107}$$

$$\approx \frac{\omega_c T}{M\pi} \sigma_x^2 \sum_{k=0}^{N-1} (a_k^2 + 2a_k \Delta a_k) \leq$$

$$\frac{\omega_c T}{M\pi} \sigma_x^2 \sum_{k=0}^{N-1} (a_k^2 + 2a_k |\Delta a_k|_{max})$$

$$(\sigma_y^2)_{av} \leq \frac{\omega_c T}{M\pi} \sigma_x^2 \left(\frac{M^2}{N} + 2M|\Delta a_k|_{max}\right) \tag{108}$$

$$= \frac{M\omega_c T}{N\pi} \sigma_x^2 \left(1 + \frac{2N|\Delta a_k|_{max}}{M}\right)$$

$$= (\sigma_y^2)_{av,min} \cdot \left(1 + \frac{2N|\Delta a_k|_{max}}{M}\right)$$

What is claimed is:

1. A method for reconstruction of a nonuniformly sampled bandlimited analog signal $x_a(t)$, said nonuniformly sampled signal comprising N subsequences $x_k(m)$, k=0, 1, ..., N−1, N≧2, obtained through sampling at a sampling rate of 1/(MT) according to $x_k(m)=x_a(nMT+t_k)$, where M is a positive integer, and $t_k=kMT/N+\Delta t_k$, $\Delta t_k$ being different from zero, said method comprising
    forming a new sequence y(n) from said N subsequences $x_k(m)$ such that y(n) at least contains the same information as $x(n)=x_a(nT)$, i.e. $x_a(t)$ sampled with a sampling rate of 1/T, in a frequency region lower than $\omega_0$, $\omega_0$ being a predetermined limit frequency, by means of:
    (i) upsampling each of said N subsequences $x_k(m)$, k=0, 1, ..., N−1, by a factor M;
    (ii) filtering each of said upsampled N subsequences $x_k(m)$, k=0, 1, ..., N−1, by a respective digital filter; and
    (iii) adding said N digitally filtered subsequences to form y(n).

2. The method as claimed in claim 1 wherein the respective digital filter is a fractional delay filter and has a frequency response $G_k=a_k e^{(-j\omega sT)}$, k=0, 1, ..., N−1, in the frequency band $|\omega T|\leq \omega_0 T$, $a_k$ being a constant and s being different from an integer.

3. The method as claimed in claim 2 wherein $s=d+t_k$, d being an integer.

4. The method as claimed in claim 2 wherein the respective fractional delay filter has a frequency response $G_k=a_k A_k(e^{j\omega T})$, k=0, 1, ..., N−1, in the frequency band $\omega_0 T<|\omega T|\geq \pi$, where $A_k(e^{j\omega T})$ is an arbitrary complex function.

5. The method as claimed in claim 2 wherein the $a_k$'s are selected such that $$\sum_{k=0}^{N-1} a_k e^{-j\frac{2\pi p}{MT} t_k} = \begin{cases} M, & p=0 \\ 0, & |p|=1, 2, \ldots, K_0 \end{cases}$$

is fulfilled, wherein $K_0$ is given by $$K_0 = \left\lceil \frac{M(\omega_0 T + \omega_1 T)}{2\pi} \right\rceil - 1,$$

wherein $\lceil x \rceil$ should be read as the smallest integer larger than or equal to x, and $[-\omega_1, \omega_1]$ is the frequency band wherein said bandlimited analog signal $x_a(t)$ is found.

6. The method as claimed in claim 5 wherein the $a_k$'s are calculated as $$a=B^{-1}c,$$

a being the $a_k$'s in vector form given by $$a=[a_0 \ a_1 \ \ldots \ a_{N-1}]^T,$$

$B^{-1}$ being the inverse of B as given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $$u_k = e^{-j\frac{2\pi}{MT} t_k},$$

and c being $$c=[c_0 \ c_1 \ \ldots \ c_{2K_0}]^T,$$

wherein $$c_k = \begin{cases} M, & k=K_0 \\ 0, & k=0, 1, \ldots, 2K_0, \ k \neq K_0 \end{cases},$$

provided that $2K_0+1=N$.

7. The method as claimed in claim 5 wherein the $a_k$'s are calculated as $a = \hat{B}^{-1}\hat{c}$, a being defined as $a = [a_u \; a_{fix}]^T$, wherein $a_u$ and $a_{fix}$ contain $(2K_0+1)$ unknown $a_k$'s and $L=N-2K_0-1$ fixed constant $a_k$'s, $\hat{B}^{-1}$ being the inverse of $\hat{B}$ as given by $$\hat{B} = \begin{bmatrix} B \\ S \end{bmatrix},$$

wherein B is given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $$u_k = e^{-j\frac{2\pi}{MT}t_k},$$

S is given by $S = [S_z \; S_d]$, wherein $$S_z = \begin{bmatrix} 0 & 0 & \cdots & 0 \\ 0 & 0 & \cdots & 0 \\ \vdots & \vdots & & \vdots \\ 0 & 0 & \cdots & 0 \end{bmatrix},$$

and $S_d = \text{diag}[1 \; 1 \; \ldots \; 1]$, and
$\hat{c}$ being $\hat{c} = [c \; a_{fix}]^T$, wherein
c is given by $c = [c_0 \; c_1 \; \ldots \; c_{2K_0}]^T$, wherein $$c_k = \begin{cases} M, & k = K_0 \\ 0, & k = 0, 1, \ldots, 2K_0, \; k \neq K_0 \end{cases},$$

provided that $2K_0+1 < N$.

8. The method as claimed in claim 7 wherein $L=N-2K_0-1$ of the $a_k$'s are calculated $a_k=M/N$, $k=N-L+1, N-L+2, \ldots, N$.

9. The method as claimed in claim 7 wherein $L=N-2K_0-1$ of the $a_k$'s are calculated $a_k=0$, $k=N-L+1, N-L+2, \ldots, N$.

10. The method as claimed in claim 2 wherein $N=M$.

11. The method as claimed in claim 2 wherein $N \neq M$.

12. The method as claimed in claim 10, wherein $\omega_0$ is selected according to $$\omega_0 T \leq \frac{2\pi(K_0+1)}{M} - \omega_1 T$$

$K_0$ being given by $$K_0 = \left\lceil \frac{M(\omega_0 T + \omega_1 T)}{2\pi} \right\rceil - 1$$

wherein $\lceil x \rceil$ should be read as the smallest integer larger than or equal to x and $[-\omega_1, \omega_1]$ is the frequency band wherein said bandlimited analog signal $x_a(t)$ is found.

13. The method as claimed in claim 1 wherein the respective digital filter is a fractional delay filter and has a frequency response $G_k = a_k e^{(-j\omega sT)}$, $k=0, 1, \ldots, N-1$, in the frequency band $|\omega T| \leq \pi$, $a_k$ being a constant and s being different from an integer, and thus said new sequence y(n) formed being exactly equal to x(n).

14. The method as claimed in claim 13 wherein $s=d+t_k$, d being an integer.

15. The method as claimed in claim 13 wherein the $a_k$'s are selected such that $$\sum_{k=0}^{N-1} a_k e^{-j\frac{2\pi p}{M}t_k} = \begin{cases} M, & p = 0 \\ 0, & |p| = 1, 2, \ldots, K_0 \end{cases}$$

is fulfilled, wherein $K_0$ is given by $K_0 = M-1$.

16. The method as claimed in claim 15 wherein the $a_k$'s are calculated as $a = B^{-1}c$, a being the $a_k$'s in vector form given by $a = [a_0 \; a_1 \; \ldots \; a_{N-1}]^T$, $B^{-1}$ being the inverse of B as given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $$u_k = e^{-j\frac{2\pi}{MT}t_k},$$

and c being $c = [c_0 \; c_1 \; \ldots \; c_{2K_0}]^T$, wherein $$c_k = \begin{cases} M, & k = K_0 \\ 0, & k = 0, 1, \ldots, 2K_0, \; k \neq K_0 \end{cases}$$

provided that $2K_0+1=N$.

17. The method as claimed in claim 15 wherein the $a_k$'s are calculated as $a = \hat{B}^{-1}\hat{c}$, a being defined as $a = [a_u \ a_{fix}]^T$, wherein $a_u$ and $a_{fix}$ contain $(2K_0+1)$ unknown $a_k$'s and $L=N-2K_0-1$ fixed constant $a_k$'s, $\hat{B}^{-1}$ being the inverse of $\hat{B}$ as given by $$\hat{B} = \begin{bmatrix} B \\ S \end{bmatrix},$$

wherein B is given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $u_k = e^{-j\frac{2\pi}{MT}t_k}$

S is given by $S = [S_z \ S_d]$, wherein $$S_z = \begin{bmatrix} 0 & 0 & \cdots & 0 \\ 0 & 0 & \cdots & 0 \\ \vdots & \vdots & & \vdots \\ 0 & 0 & \cdots & 0 \end{bmatrix},$$

and $S_d = \text{diag}[1 \ 1 \ \ldots \ 1]$, and
$\hat{c}$ being $\hat{c} = [c \ a_{fix}]^T$, wherein
c is given by $c = [c_0 \ c_1 \ \ldots \ c_{2K_0}]^T$, wherein $c_k = \begin{cases} M, & k = K_0 \\ 0, & k = 0, 1, \ldots, 2K_0, \ k \neq K_0 \end{cases}$, provided that $2K_0+1 < N$.

18. The method as claimed in claim 17 wherein $L=N-2K_0-1$ of the $a_k$'s are calculated $a_k=M/N$, $k=N-L+1, N-L+2, \ldots, N$.

19. The method as claimed in claim 13 wherein $N>M$.

20. The method as claimed in claim 1 wherein said N subsequences $x_k(m)$ are quantized prior to being upsampled.

21. A digital signal processing apparatus for reconstruction of a nonuniformly sampled bandlimited analog signal $x_a(t)$, said nonuniformly sampled signal comprising N subsequences $x_k(m)$, $k=0, 1, \ldots, N-1, N \geq 2$, obtained through sampling at a sampling rate of $1/(MT)$ according to $x_k(m) = x_a(nMT+t_k)$, where M is a positive integer, and $t_k=kMT/N+\Delta t_k$, $\Delta t_k$ being different from zero, wherein said apparatus is adapted to perform the method as claimed in claim 1.

22. A digital signal processing apparatus for reconstruction of a nonuniformly sampled bandlimited analog signal $x_a(t)$, said nonuniformly sampled signal comprising N subsequences $x_k(m)$, $k=0, 1, \ldots, N-1, N \geq 2$, obtained through sampling at a sampling rate of $1/(MT)$ according to $x_k(m) = x_a(nMT+t_k)$, where M is a positive integer, and $t_k=kMT/N+\Delta t_k$, $\Delta t_k$ being different from zero, said apparatus comprising digital signal processing means for forming a new sequence $y(n)$ from said N subsequences $x_k(m)$ such that $y(n)$ at least contains the same information as $x(n)=x_a(nT)$, i.e. $x_a(t)$ sampled with a sampling rate of $1/T$, in a frequency region lower than $\omega_0$, $\omega_0$ being a predetermined limit frequency, by means of:

(i) upsampling each of said N subsequences $x_k(m)$, $k=0, 1, \ldots, N-1$, by a factor M, M being a positive integer;

(ii) filtering each of said upsampled N subsequences $x_k(m)$, $k=0, 1, \ldots, N-1$, by a respective digital filter; and (iii) adding said N digitally filtered subsequences to form $y(n)$.

23. The apparatus as claimed in claim 22 wherein the respective digital filter is a fractional delay filter and has a frequency response $G_k = a_k e^{(-j\omega sT)}$, $k=0, 1, \ldots, N-1$, at least in the frequency band $|\omega T| \leq \omega_0 T$, $a_k$ being a constant and s being different from an integer and $s=d+t_k$, d being an integer.

24. The apparatus as claimed in claim 23 wherein the $a_k$'s are calculated as $a = B^{-1}c$, a being the $a_k$'s in vector form given by $a = [a_0 \ a_1 \ \ldots \ a_{N-1}]^T$, $B^{-1}$ being the inverse of B as given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $u_k = e^{-j\frac{2\pi}{MT}t_k}$, and c being $c = [c_0 \ c_1 \ \ldots \ c_{2K_0}]^T$, wherein $$c_k = \begin{cases} M, & k = K_0 \\ 0, & k = 0, 1, \ldots, 2K_0, \ k \neq K_0 \end{cases},$$

provided that $2K_0+1=N$.

25. The apparatus as claimed in claim 23 wherein the $a_k$'s are calculated as $$a = \hat{B}^{-1}\hat{c},$$

a being defined as $$a = [a_u \ a_{fix}]^T,$$

wherein $a_u$ and $a_{fix}$ contain $(2K_0+1)$ unknown $a_k$'s and $L=N-2K_0-1$ fixed constant $a_k$'s, $\hat{B}^{-1}$ being the inverse of $\hat{B}$ as given by $$\hat{B} = \begin{bmatrix} B \\ S \end{bmatrix},$$

wherein B is given by $$B = \begin{bmatrix} u_0^{-K_0} & u_1^{-K_0} & \cdots & u_{N-1}^{-K_0} \\ u_0^{-(K_0-1)} & u_1^{-(K_0-1)} & \cdots & u_{N-1}^{-(K_0-1)} \\ \vdots & \vdots & & \vdots \\ u_0^{K_0} & u_1^{K_0} & \cdots & u_{N-1}^{K_0} \end{bmatrix},$$

wherein $$u_k = e^{-j\frac{2\pi}{MT}t_k},$$

S is given by $$S = [S_z \ S_d],$$

wherein $$S_z = \begin{bmatrix} 0 & 0 & \cdots & 0 \\ 0 & 0 & \cdots & 0 \\ \vdots & \vdots & & \vdots \\ 0 & 0 & \cdots & 0 \end{bmatrix},$$

and $$S_d = \mathrm{diag}[1 \ 1 \ \ldots \ 1],$$

and $\hat{c}$ being $$\hat{c} = [c \ a_{fix}]^T,$$

wherein c is given by $$c = [c_0 \ c_1 \ \ldots \ c_{2K_0}]^T,$$

wherein $$c_k = \begin{cases} M, & k = K_0 \\ 0, & k = 0, 1, \ldots, 2K_0, \ k \neq K_0 \end{cases},$$

provided that $2K_0+1<N$.

26. A method for compensation of time skew in a time-interleaved analog-to-digital converter (ADC) system comprising a plurality of analog-to-digital converters (ADCs), said method comprising performing the method as claimed in claim 1 wherein each of said N subsequences $x_k(m)$, k=0, 1, ..., N−1, N≧2 is sampled by a respective one of said analog-to-digital converters.

27. A time-interleaved analog-to-digital converter (ADC) system comprising a plurality of analog-to-digital converters (ADCs), said system comprising a digital signal processing apparatus as claimed in claim 21, wherein each of said N subsequences $x_k(m)$, k=0, 1, ..., N−1, N≧2 is sampled by a respective one of said analog-to-digital converters.

28. A computer program product loadable into the internal memory of a digital signal processing apparatus, comprising software code portions for performing the method as claimed in claim 1 when said product is run on said apparatus.

* * * * *